(12) United States Patent
Chan et al.

(10) Patent No.: US 12,324,102 B2
(45) Date of Patent: Jun. 3, 2025

(54) SEMICONDUCTOR STORAGE DEVICE INCLUDING STAGGERED SEMICONDUCTOR MEMORY DEVICES ON OPPOSED SURFACES

(71) Applicant: Western Digital Technologies, Inc., San Jose, CA (US)

(72) Inventors: Fu Xing Chan, Penang (MY); Chun Sean Lau, Penang (MY); Bo Yang, Dublin, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 163 days.

(21) Appl. No.: 18/222,665

(22) Filed: Jul. 17, 2023

(65) Prior Publication Data

US 2024/0260194 A1 Aug. 1, 2024

Related U.S. Application Data

(60) Provisional application No. 63/441,370, filed on Jan. 26, 2023.

(51) Int. Cl.
| | |
|---|---|
| *H05K 1/18* | (2006.01) |
| *H01L 25/00* | (2006.01) |
| *H01L 25/065* | (2023.01) |
| *H01L 25/18* | (2023.01) |

(52) U.S. Cl.
CPC .......... *H05K 1/181* (2013.01); *H01L 25/0652* (2013.01); *H01L 25/18* (2013.01); *H01L 25/50* (2013.01); *H01L 2225/06506* (2013.01); *H01L 2225/06562* (2013.01); *H01L 2225/06586* (2013.01); *H05K 2201/0154* (2013.01); *H05K 2201/10159* (2013.01); *H05K 2201/10515* (2013.01); *H05K 2201/10984* (2013.01)

(58) Field of Classification Search
CPC .......... H05K 1/02; H05K 1/0231; H05K 1/18; H05K 1/181–187; H01L 21/52; H01L 21/56; H01L 21/78; H01L 23/02; H01L 23/31; H01L 23/36; G11C 5/00; G11C 5/04; G11C 5/141; G11C 5/147
USPC .......... 361/764–774, 792–795, 803; 257/686, 257/723, 777–778; 365/194, 232
See application file for complete search history.

(56) References Cited

U.S. PATENT DOCUMENTS

| | | | | |
|---|---|---|---|---|
| 5,982,654 | A * | 11/1999 | Corisis ................... | H05K 1/181 365/189.08 |
| 6,243,272 | B1 * | 6/2001 | Zeng ...................... | H05K 1/181 174/262 |
| 6,633,078 | B2 * | 10/2003 | Hamaguchi ............. | H01L 23/13 257/777 |
| 7,102,905 | B2 * | 9/2006 | Funaba .................. | H05K 1/181 257/E25.011 |

(Continued)

*Primary Examiner* — Tuan T Dinh
(74) *Attorney, Agent, or Firm* — Pearl Cohen Zedek Latzer Baratz LLP

(57) ABSTRACT

A semiconductor storage device such as an SSD includes a pliable printed circuit board (PCB) having semiconductor memory devices mounted by solder balls on first and second opposed major surfaces. The memory devices are mounted so as to be staggered and/or partially overlapping with each other on the first and second surfaces of the PCB in at least one direction. The staggered arrangement allows the PCB to flex upon warping of the memory devices mounted on the PCB.

19 Claims, 7 Drawing Sheets

(56) References Cited

U.S. PATENT DOCUMENTS

| | | | | |
|---|---|---|---|---|
| 7,224,595 | B2* | 5/2007 | Dreps | G11C 5/04 |
| | | | | 361/728 |
| 7,392,338 | B2* | 6/2008 | Rajan | G11C 5/147 |
| | | | | 711/110 |
| 8,130,560 | B1* | 3/2012 | Rajan | G11C 8/00 |
| | | | | 365/63 |
| 8,143,720 | B2* | 3/2012 | Lambrecht | H01L 25/18 |
| | | | | 257/725 |
| 9,704,559 | B2* | 7/2017 | Hayashi | G11C 7/10 |
| 10,629,263 | B2* | 4/2020 | Yamasaki | G11C 5/141 |
| 2004/0071040 | A1* | 4/2004 | Funaba | G11C 5/063 |
| | | | | 365/232 |
| 2007/0056409 | A1* | 3/2007 | Dickey | B25B 13/481 |
| | | | | 81/57.3 |
| 2008/0123303 | A1* | 5/2008 | Sugano | G11C 5/00 |
| | | | | 361/728 |
| 2010/0296236 | A1* | 11/2010 | Schuette | G06F 3/0658 |
| | | | | 29/829 |
| 2015/0171028 | A1* | 6/2015 | Jo | H01L 25/0657 |
| | | | | 257/713 |
| 2020/0083623 | A1* | 3/2020 | Huang | H05K 1/111 |

* cited by examiner

SEMICONDUCTOR STORAGE DEVICE INCLUDING STAGGERED SEMICONDUCTOR MEMORY DEVICES ON OPPOSED SURFACES

CLAIM OF PRIORITY

The present application claims priority from U.S. Provisional Patent Application No. 63/441,370, entitled "SEMICONDUCTOR STORAGE DEVICE INCLUDING STAGGERED SEMICONDUCTOR MEMORY DEVICES ON OPPOSED SURFACES," filed Jan. 26, 2023, which is incorporated by reference herein in its entirety.

BACKGROUND

The strong growth in demand for portable consumer electronics is driving the need for high-capacity storage devices. Non-volatile semiconductor memory devices are widely used to meet the ever-growing demands on digital information storage and exchange. Their portability, versatility and rugged design, along with their high reliability and large capacity, have made such memory devices ideal for use in a wide variety of electronic products, including for example digital cameras, digital music players, video game consoles, computers, cellular telephones and SSD (solid state drives).

While many varied packaging configurations are known, flash memory semiconductor packages may in general be assembled as system-in-a-package (SIP) or multichip modules (MCM), where a controller die and a number of memory dies are mounted and interconnected to an upper surface of substrate such as a printed circuit board.

Electrical connections are formed between the dies and the substrate. In a so-called BGA (ball grid array package), solder balls may be mounted on a bottom surface of the SiP memory for electrically and physically coupling the SiP memory to the printed circuit board. It is advantageous to mount additional SiP memory packages to the substrate to increase or maximize storage capacity.

SSD and other types of storage devices may be formed of a number of semiconductor memory packages mounted to a printed circuit board. In order to maximize the storage capacity of these devices, it may be advantageous to mount the SiP memory packages on both the top and bottom surfaces of the PCB, aligned over each other. However, semiconductor packages often warp when they are mounted on a printed circuit board (PCB) due to a number of factors, including a mismatch of the coefficients of thermal expansion (CTE) of the materials used in the semiconductor package and PCB, respectively, the temperature at which the package is soldered to the PCB, and the mechanical stress placed on the package during the soldering process.

With semiconductor packages aligned with each other on the top and bottom of the PCB, the section of the PCB including the aligned and warped semiconductor packages is simultaneously pulled upward and downward with the warping packages. The packages can warp to the point where the strain energy density of one or more of the solder balls becomes too large, resulting in the solder ball cracking, breaking and/or separating from the PCB. The strain energy density of a solder ball is a measure of the amount of energy that is stored in the ball due to applied stresses, such as those caused by thermal cycling or mechanical loading.

DETAILED DESCRIPTION

Figure 1:
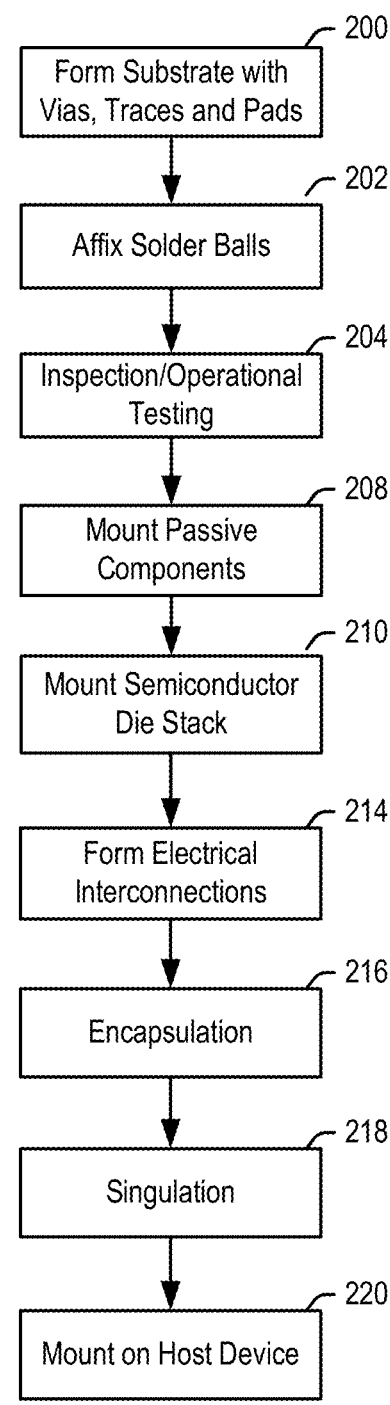
FIG. 1 is a flowchart of the overall assembly process of a semiconductor device according to embodiments of the present technology.

The present technology will now be described with reference to the figures, which in embodiments, relate to a semiconductor host device such as an SSD including a pliable printed circuit board (PCB) having semiconductor devices mounted by solder balls on first and second opposed major surfaces. The semiconductor devices may be mounted so as to be staggered and/or partially overlapping with each other on the first and second surfaces of the PCB in at least one direction. The degree of overlap may vary in different embodiments. Upon warping of the semiconductor devices, either upon cooling after being mounted on the PCB or upon heating during use, the pliable PCB flexes to maintain contact with the warped semiconductor devices and to reduce the strain energy density in the soldered connections. This prevents cracking, breaking and/or separation of the solder balls from the PCB. The less the overlap between the semiconductor devices on first and second surfaces, the more the PCB is free to deform.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is +0.15 mm, or alternatively, +2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

An embodiment of the present technology will now be explained with reference to the flowchart of FIG. 1 and the edge and top views of FIGS. 2 through 15. FIGS. 2-7 show a semiconductor device 100, or portions thereon, and FIGS. 8-15 show a host device (also referred to as a storage device) 140 including semiconductor devices 100. Referring now to FIG. 1 and the edge and top views of FIGS. 2 and 3, there is shown a substrate 102, which as used herein, refers to a signal-carrier medium provided for transferring electrical signals between semiconductor dies mounted on the substrate and a host device, as explained below. In one embodiment of the present technology, the substrate 102 may be a printed circuit board, but the substrate 102 may be formed of other signal-carrier mediums such as flex tapes, interposers or combinations thereof.

The substrate 102 is formed in step 200 to include conductive layers on at least a first (e.g., top) major surface 104 and a second (e.g., bottom) major surface 106. The first and second major surfaces 104, 106 may be separated by a dielectric core. There may be additional conductive layers additional dielectric cores in further embodiments. Electrically conductive vias 108 may be formed through the dielectric core between the first and second major surfaces 104, 106, and the conductive layers may be etched in a photolithographic process to define electrical traces 110 and contact pads 112 and 114.

Figure 2:
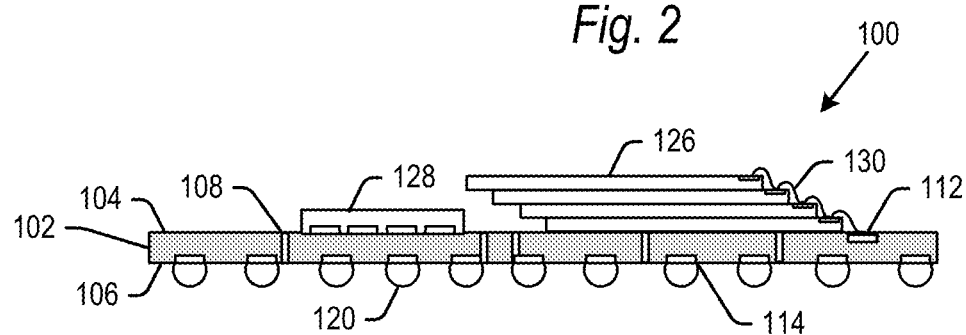
FIG. 2 is a side view of a semiconductor device during assembly according to an embodiment of the present technology.

As shown in FIG. 2, the contact pads 112 are provided on the first major surface 104 for electrically bonding semiconductor dies to the substrate 102 as explained below, and the contact pads 114 are provided on the second major surface 106 for electrically bonding solder balls to the substrate 102 as explained below. The vias 108 and electrical traces 110 are used to route electrical signals along and between the first and second major surfaces 104, 106. The patterns of vias 108, traces 110 and contact pads 112, 114 shown in the figures is for illustrative purposes only and may vary in further embodiments. The figures show a single substrate 102, but it is understood that the semiconductor device of the present technology may be assembled from a panel of substrates to achieve economies of scale.

Figure 4:
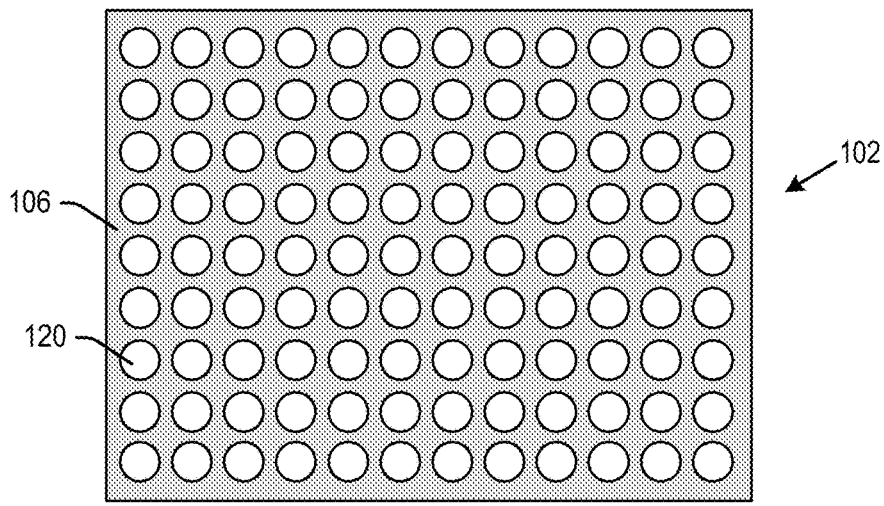
FIGS. 4-6 are bottom views of a semiconductor device during assembly according to an embodiment of the present technology.
Figure 5:
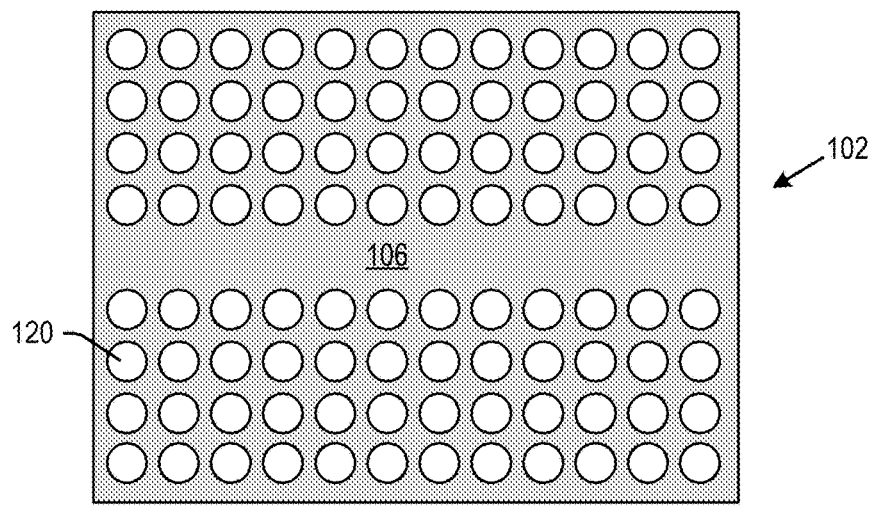
Figure 6:
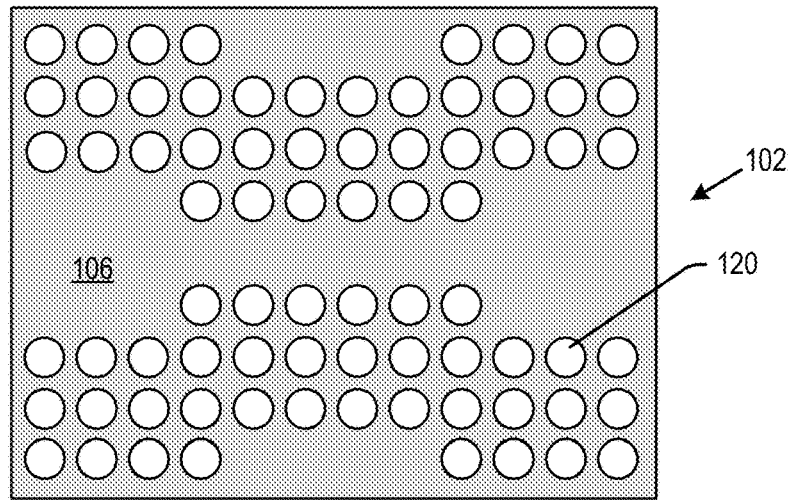
Figure 7:
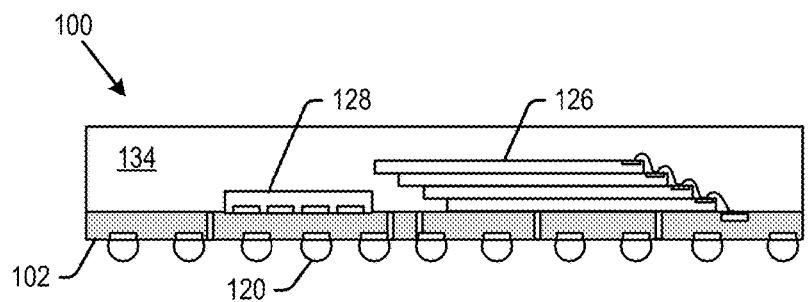
FIG. 7 is an edge view of a completed semiconductor device according to embodiments of the present technology.

Referring again to FIG. 1, solder balls 120 may be affixed in step 202 to the contact pads 114 on the second major surface 106 of substrate 102 as shown in FIGS. 2 and 4-6. The balls 120 may be solder, but may also be formed of copper, aluminum tin, gold, alloys thereof, or other flowable metals and materials in further embodiments. The solder balls 120 may be applied in a variety of patterns. FIGS. 4-6 show three possible patterns of solder balls 120 on the second major surface 106 of substrate 102. FIG. 4 shows a first pattern having a maximum density of solder balls 120. FIG. 5 shows a second pattern where the solder balls are divided into two groups. There may be more than two groups in further embodiments. FIG. 6 shows ⅓ pattern of solder balls with a density of solder balls in the corners are greater than away from the corners. The patterns and numbers of solder balls shown in FIGS. 4-6 is by way of example only, and the pattern and/or number of solder balls on surface 106 of substrate 102 may vary in further embodiments.

As explained below, the present technology mounts semiconductor devices 100 to a host device using the solder balls 120 in such a way as to maintain the strain energy density within the solder balls 120 below some predefined threshold. However, this threshold may be increased by providing solder balls 120 with a high tensile strength. The strength of the solder balls 120 may depend on different factors, including the type of alloy used, the size and shape of the balls 120, and the conditions under which the solder is applied.

For example, in embodiments, the solder balls 120 may be made from higher-strength alloys, such as those containing a higher percentage of tin. As a reference, the solder balls 120 may be formed of a Sn63 Pb37 alloy having a tensile strength of about 20 MPa. In a further example, the solder balls 120 may be formed of a Sn96.5 Ag3.0 Cu0.5 alloy having a tensile strength of about 60 MPa. Other alloys and materials are contemplated for solder balls 120, having other tensile strengths. Additionally, larger solder balls will typically be stronger than smaller ones. The height of the solder balls 120 may for example range from 50 microns (μm) to 300 μm, and the diameter of the solder balls 120 may for example range from 100 μm to 500 μm, though both the height and diameter of the solder balls 120 may vary outside of these ranges in further embodiments. Solder balls near the upper end of these range will be able to withstand higher strain energy densities. The pitch between solder balls 120, for example in the patterns shown in FIG. 4, may be about 1 mm, though the pitch may be greater or smaller than that in further embodiments.

The completed substrate 102 may be inspected and operationally tested in step 204. These inspections may for example include an automatic optical inspection (AOI), an automated visual inspection (AVI) and/or a final visual inspection (FVI) to check for defects, contamination, scratches and discoloration. One or more of these steps may be omitted or performed in a different order in further embodiments. Assuming the substrate 102 passes inspection, passive components 122 (FIG. 3) may next be affixed to the top surface 104 of the substrate 102 in a step 208. The one or more passive components may include for example one or more capacitors, resistors and/or inductors, though other components are contemplated. The passive components 122 shown are by way of example only, and the number, type and position may vary in further embodiments.

Figure 3:
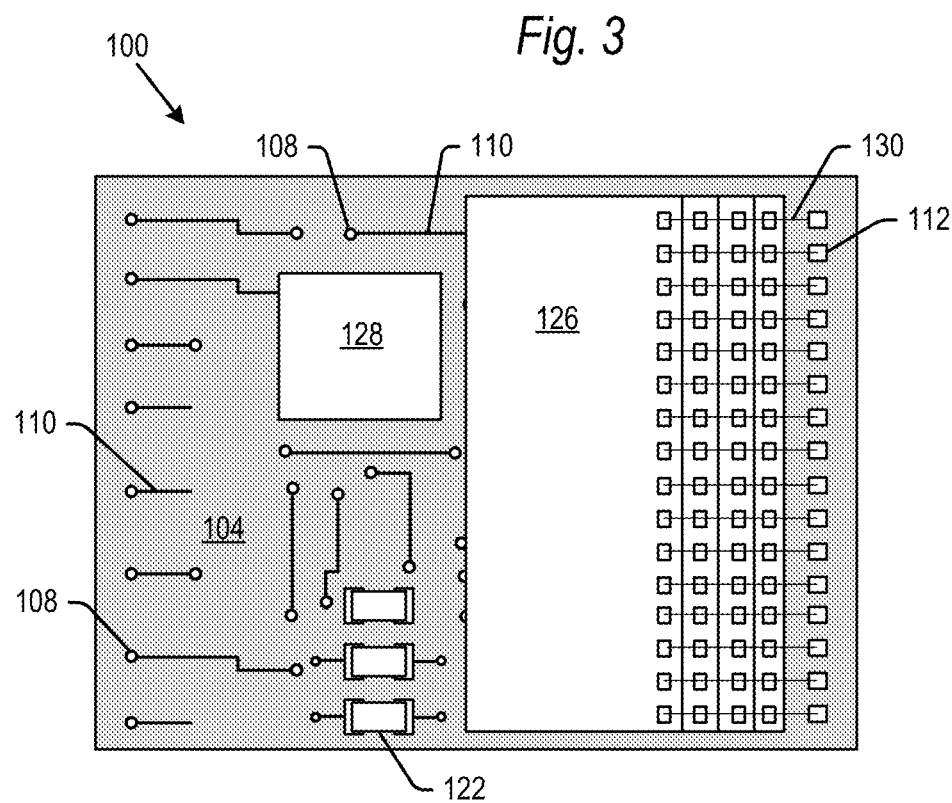
FIG. 3 is a top view of a semiconductor device during assembly according to an embodiment of the present technology.

In step 210, one or more semiconductor dies 126, 128 may be mounted on the top surface 104 of the substrate 102. As shown in the edge and top views of FIGS. 2 and 3, the semiconductor dies 126 may for example be one or more memory dies such as 2D NAND flash memory or 3D BiCS (Bit Cost Scaling), V-NAND or other 3D flash memory, but other types of dies 126 may be used. These other types of semiconductor dies include but are not limited to RAM such as an SDRAM, DDR SDRAM, LPDDR and GDDR.

Where multiple semiconductor dies 126 are included, the semiconductor dies 126 may be stacked atop each other in an offset stepped configuration to form a die stack as shown in FIGS. 2 and 3. The number of dies 126 shown in the stack is by way of example only, and embodiments may include different numbers of semiconductor dies, including for example 1, 2, 4, 8, 16, 32 or 64 dies. There may be other numbers of dies in further embodiments. The dies may be affixed to the substrate and/or each other using a die attach film. As one example, the die attach film may be cured to a B-stage to preliminarily affix the dies 126 in the stack, and subsequently cured to a final C-stage to permanently affix the dies 126 to the substrate 102.

FIGS. 2 and 3 also show a semiconductor die 128 which may for example be a controller die surface mounted to the substrate 102. Controller die 128 may for example be an ASIC for controlling transfer of signals and data to and from the memory dies 126. The controller die 128 may be flip-chip mounted to contact pads 112 by solder or Cu-to-Cu bonding. The controller die 128 may alternatively be electrically coupled to substrate 102 with bond wires as explained in the following paragraph.

In step 214, the semiconductor memory dies 126 may be electrically interconnected to each other and to the contact pads 112 of the substrate 102. FIGS. 2 and 3 show bond wires 130 formed between corresponding (like channel) die bond pads on respective dies 126 down the stack, and then bonded to contact pads 112 on the substrate 102. The bond wires 130 may be formed by a ball-bonding technique, but other wire bonding techniques are possible. The semiconductor dies 126 may be electrically interconnected to each other and the substrate 102 by other methods in further embodiments, including by through-silicon vias (TSVs) and flip-chip technologies. As noted, when not surface mounted, the controller die 128 may also be wire bonded to the substrate in step 214.

Following electrical connection of the dies 126, 128 to the substrate 102, the semiconductor device 100 may undergo an encapsulation process in step 216. As shown in the edge view of FIG. 7, a mold compound 134 may be applied over the components on the top surface 104 at the substrate 102 to encapsulate and protect the passive components 122 and the semiconductor dies 126, 128. Mold compound 134 may include for example solid epoxy resin, Phenol resin, fused silica, crystalline silica, carbon black and/or metal hydroxide. Other mold compounds from other manufacturers are contemplated. The mold compound may be applied by various known processes, including by FFT (flow free thin) molding, compression molding, transfer molding or injection molding techniques.

At this stage in the assembly, the individual semiconductor devices 100 may still be part of a substrate panel. After the semiconductor devices 100 are encapsulated, they may be singulated from the panel in step 218 to form the completed semiconductor devices 100 as shown for example in the edge view of FIG. 7. The individual semiconductor devices 100 may be singulated from the panel using any of a variety of cutting methods including by saw blade, laser, waterjet or other methods.

Once completed, the semiconductor devices 100 may be mounted on a host device in step 220 using solder balls 120. In embodiments, the host device may be an SSD including a PCB. As noted in the Background section, in order to maximize storage capacity, the semiconductor devices may be mounted on opposed major surfaces of the PCB. In accordance with aspects of the present technology, the semiconductor devices are mounted on the opposed surfaces of a PCB in such a way as to minimize a possibility that one or more of the solder balls 120 crack, break and/or separate from the PCB.

Figure 8:
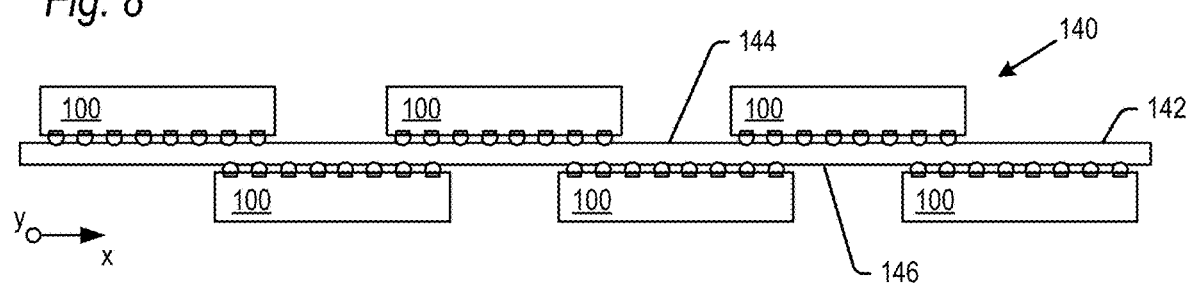
FIG. 8 is an edge view of a host device including staggered semiconductor devices on opposed surfaces of a printed circuit board according to embodiments of the present technology.
Figure 9:
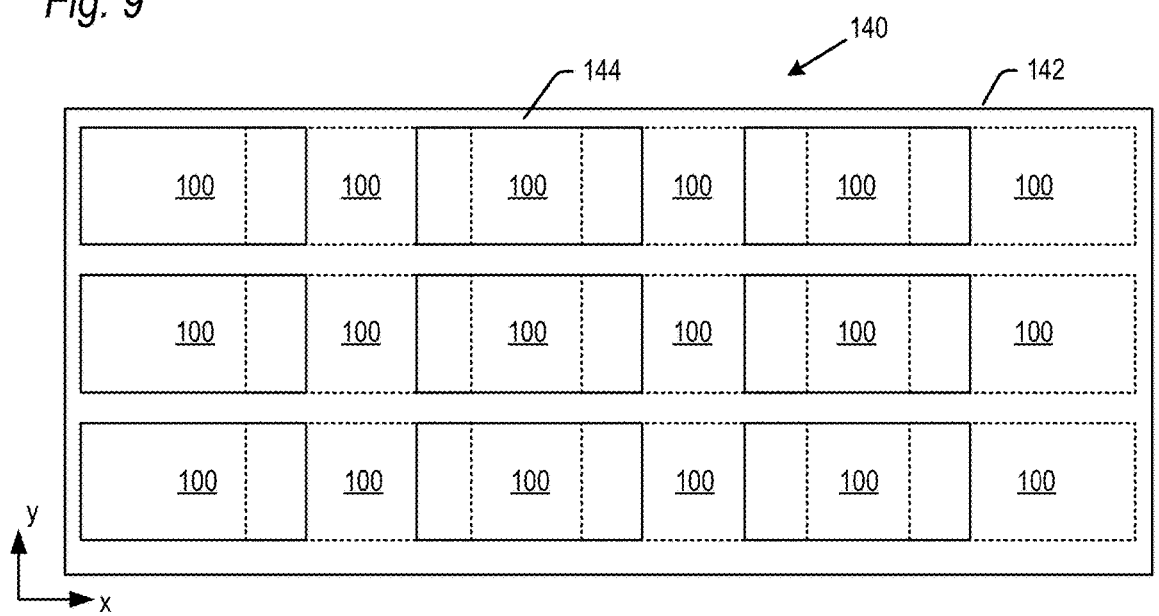
FIG. 9 is a top view of a host device including staggered semiconductor devices on opposed surfaces of a printed circuit board according to embodiments of the present technology.

FIGS. 8 and 9 are edge and top views, respectively, of a storage device 140 including a pliable PCB 142 having a first (e.g., top) surface 144 and a second (e.g., bottom) surface 146. As shown, multiple semiconductor devices 100 may be mounted on both the first and second major surfaces 144, 146 of PCB 142 in a 2-dimensional x, y array. FIG. 8 is an edge view with the horizontal x-axis and the y-axis into the page, showing the semiconductor devices 100 on the first (top) surface 144 of PCB 142, and showing semiconductor devices 100 on the second (bottom) surface partially overlapping the first surface semiconductor dies 100. FIG. 9 is a top view, in the plane of the x-y axes, showing the semiconductor devices 100 on the surface 144 of PCB 142, and showing semiconductor devices 100 on the second surface in phantom, along the x-axis.

The number of semiconductor devices 100 positioned on surfaces 144, 146 of PCB 142 is shown by way of example only, and there may be more or less semiconductor devices along the x-axis and/or y-axis in further embodiments. There can be as few as a single semiconductor device 100 on the first surface 144 and a single semiconductor device 100 on the second surface 146 staggered with respect to the device 100 on surface 144. In embodiments, the number of semiconductor devices 100 on the first surface 144 match the number of semiconductor devices 100 on the second surface 146. However, the number of semiconductor devices 100 on respective surfaces 144, 146 may be different in further embodiments.

In order to physically and electrically couple the semiconductor devices 100 on the first and second surfaces 144, 146 of PCB 142, the solder balls 120 of each semiconductor device 100 are placed on contact pads of the PCB 142. Thereafter, the semiconductor devices 100 and PCB 142 may be heated to reflow the solder balls and permanently affix the semiconductor devices 100 to the PCB 142 once the devices and PCB are cooled. The reflow process may for example be done in two separate steps. First, with the surface 144 facing upward, the semiconductor devices 100 may be affixed to the surface 144 using gravity. The PCB 142 may then be turned over, and the semiconductor devices 100 may be affixed to the surface 146 using gravity. The devices 100 may be affixed to respective surfaces 144, 146 of PCB 142 in a single process in further embodiments.

As noted in the Background section, the semiconductor devices 100 may warp, either during the cooling process after reflowing the solder balls 120, or as heat is generated or dissipated during read/write operations on the semiconductor devices 100 of storage device 140. In accordance with aspects of the present technology, the semiconductor devices 100 are mounted on respective surfaces 144, 146 in such a way that allows the PCB 142 to warp with the semiconductor devices 100 on the first surface 144, and also to warp with the semiconductor devices 100 on the second surface 146.

In embodiments, this functionality is accomplished by staggering, or partially overlapping, the positions of the semiconductor devices 100 on respective surfaces 144, 146 at least along one of the x, y axes. FIGS. 8 and 9 show an example with the semiconductor devices 100 are staggered along the x-axis to partially overlap with each other. In the particular embodiment shown, the devices 100 are staggered so that only the last two rows of solder balls 120 in each semiconductor device 100 overlap with each other along the x-axis. As will be explained hereinafter, the semiconductor devices may be staggered to overlap by different amounts in further embodiments.

Figure 10:
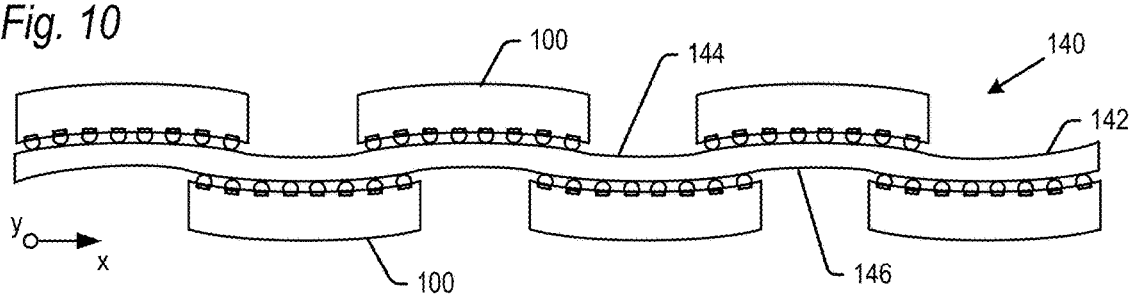
FIGS. 10-13 are edge views of a host device including warped semiconductor devices staggered to differing degrees on opposed surfaces of a printed circuit board according to embodiments of the present technology.

FIG. 10 illustrates storage device 140 upon warping of the semiconductor devices 100. Because the semiconductor devices 100 on the respective surfaces are staggered, the PCB 142 is free to flex with the semiconductor devices 100. That is, as the semiconductor devices 100 on the top and bottom surfaces 144, 146 warp up and down, the staggering of the semiconductor devices allows respective portions of the PCB 142 to flex up and down as well with the semiconductor devices. This maintains contact between the PCB 142 and the solder balls 120 of the warped semiconductor devices on the first and second surfaces 144, 146, and maintains the strain energy density of these solder balls below a predefined threshold.

Figure 11:
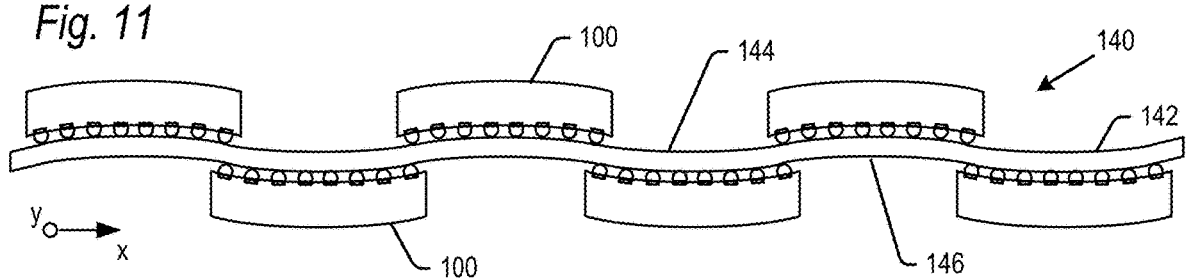
Figure 12:
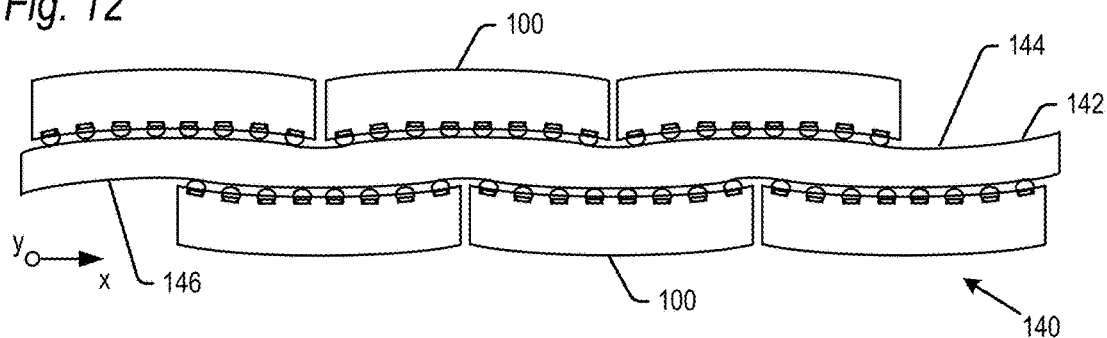
Figure 13:
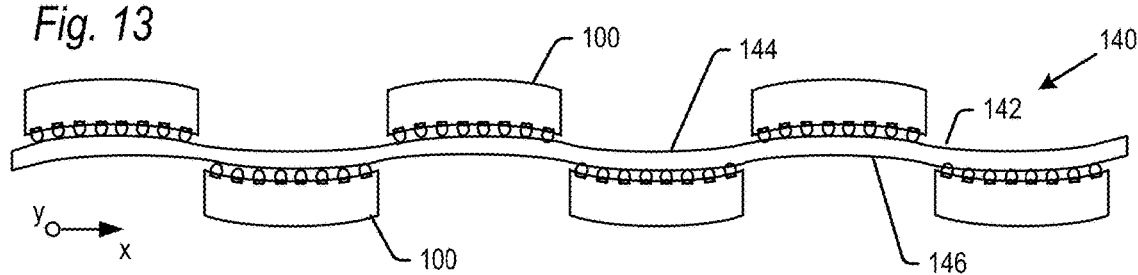

To the extent there is an overlap between devices 100 on the first and second surfaces 144, 146, the parameters of the system are controlled to maintain the strain energy density of the solder balls at the overlapping sections below a predefined threshold. These parameters that are controlled include the degree of overlap. In particular, the less the overlap, the greater the freedom of the PCB to warp with the semiconductor devices on both the first and second surfaces. FIGS. 11 and 12 illustrate two further embodiments with varying overlap of the first and second semiconductor devices 100 on respective first and second surfaces 144, 146. In FIG. 11, there is a small overlap of, for example, 5% to 10% of the overall length (in the x-direction) of the semiconductor devices 100. The degree of overlap may be smaller than this in further embodiments. In FIG. 12, there is a large overlap of, for example, 40% to 45% of the overall length (in the x-direction) of the semiconductor devices 100. The degree of overlap may be larger than this in further embodiments, approaching 50%. The degree of overlap may further be anywhere in between the overlap shown in FIGS. 11 and 12 in further embodiments, including for example between 20% and 30% and including for example 25%. In a further embodiment shown in FIG. 13, the semiconductor devices 100 are staggered on the first and second major surfaces 144, 146 with no overlap. While inefficient from a device density perspective, this embodiment provides the least amount of strain energy density in solder balls 120 as compared to the other illustrated embodiments.

Another parameter which may be controlled to maintain the strain energy density level of the overlapping solder balls 120 below some predefined threshold is the size, strength and pattern of the solder balls themselves. Some examples of the type, tensile strength and pattern of solder balls 120 is set forth above.

A further parameter affecting the strain energy density level of the solder balls 120 is the degree of warpage of semiconductor devices 100. The degree of warpage of the semiconductor device 100 is a function of several features, including for example the aspect ratio (width of the device/length of the device), the thickness of the device, and the ratio of the size of the semiconductor dies 126, 128 versus the size of the molding compound. In embodiments, the aspect ratio of the semiconductor device 100 may range from 0.51 to 1.95, though the aspect ratio may vary above and below this range in further embodiments. The thickness of the semiconductor device 100 may be 1.4 mm to 1.6 mm, though this thickness may vary above and below this range in further embodiments. These features will often be determined by factors that take priority over warpage reduction, including for example the storage capacity of the semiconductor device 100.

A further parameter which may be controlled is the pliability of the PCB 142. The pliability of a printed circuit board (PCB) refers to its ability to bend or flex without breaking. PCBs 142 made from more pliable materials will further reduce the strain energy density levels in any overlapping solder balls 120. PCBs are typically made of a rigid material, such as fiberglass-reinforced epoxy, and are not designed to be pliable. However, the PCB of the present technology may be formed of certain types of fiberglass, polyimides and other polymers and materials that have some degree of flexibility and pliability. In further embodiments, the PCB may be a so-called flex PCB, which is made of a flexible polyimide dielectric film layer sandwiched between prepreg and conductive layers. The pliability of PCB 142 can also depend on other factors such as its thickness. In general, thinner PCBs will be more pliable than thicker ones. Example thicknesses of PCB 142 include 0.8 mm, 1.2 mm and 1.6 mm. These thicknesses are by way of example only, and may vary below, above and in between these thicknesses in further embodiments.

Each of the above described parameters: 1) the degree of overlap of the semiconductor devices on the first and second respective surfaces 144, 146; 2) the size, strength and pattern of the solder balls; 3) features of the semiconductor device 100; and 4) the pliability of the PCB 142 may be controlled independently of each other, or in a coordinated manner with each other to maintain the strain energy density levels of the solder balls 120 below a predefined threshold. As an example where these parameters may be coordinated with each other, once a particular design of a semiconductor device is selected (including device features and solder ball type, strength and pattern) and once a PCB is selected, the degree of overlap of the semiconductor devices may then be selected by theoretical or empirical methods to maintain the strain energy density levels of the solder balls below a predefined threshold.

In general, the maximum strain energy density for solder balls 120 may be determined from the known parameters of the solder balls 120. This value, or a smaller one, may then be used as the predefined threshold for the strain energy density of the solder balls 120. The degree of overlap of the semiconductor devices 100 and/or the pliability of the PCB 142 may then be selected that will maintain the strain energy density of solder balls 120 below the predefined threshold.

Figure 14:
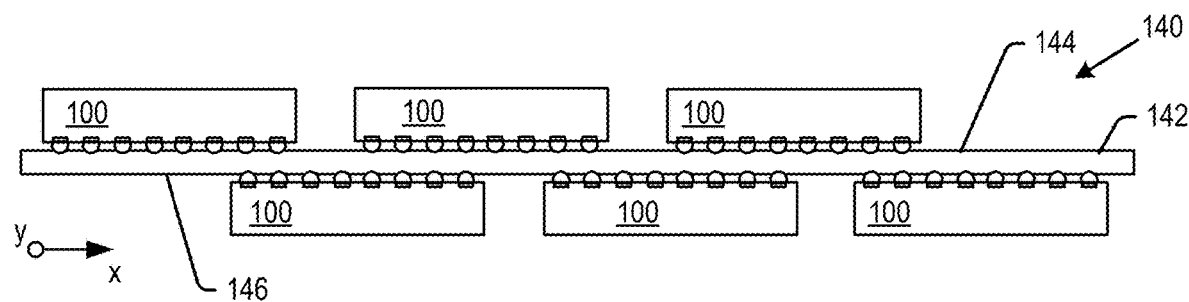
FIG. 14 is an edge view of a host device including asymmetrically staggered semiconductor devices on opposed surfaces of a printed circuit board according to embodiments of the present technology.
Figure 15:
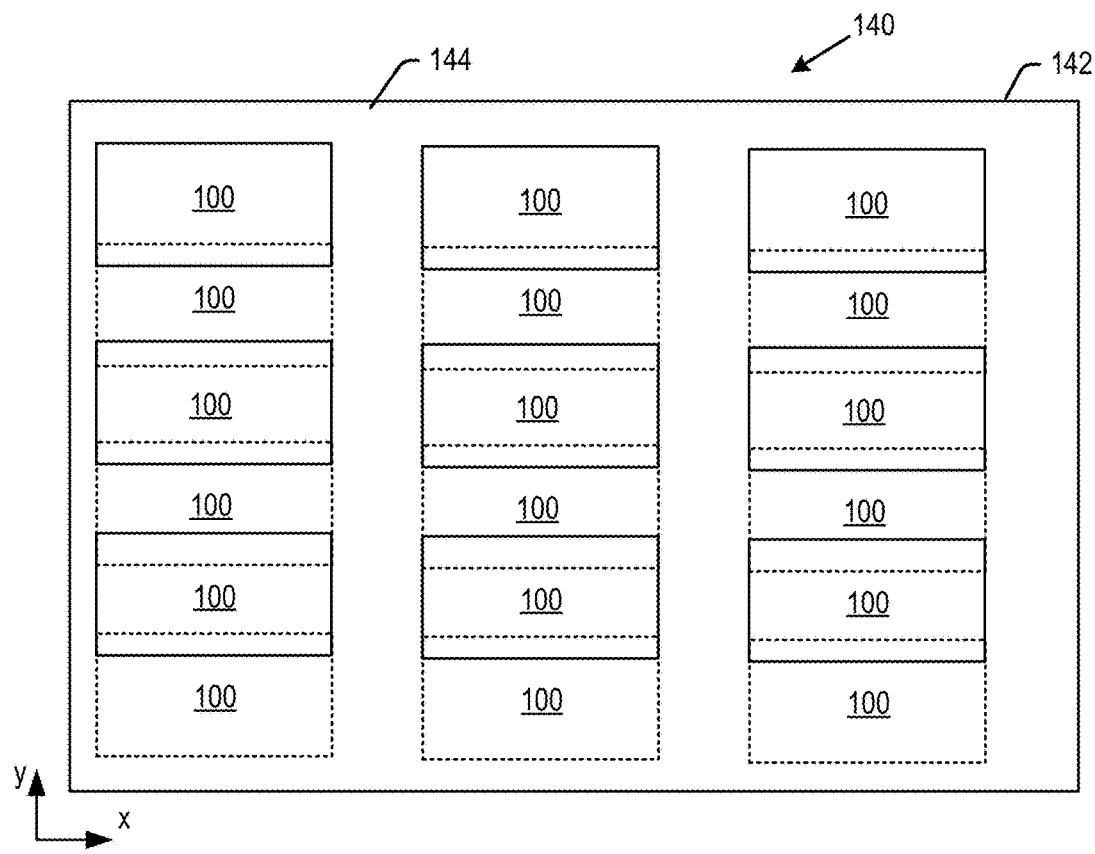
FIG. 15 is a top view of a host device including semiconductor devices staggered along a width dimension of the semiconductor devices on opposed surfaces of a printed circuit board according to embodiments of the present technology.

In embodiments described above, a semiconductor device 100 on a surface 144, 146 may be symmetrically overlapped by devices 100 on the opposed surface. Such an example is shown in FIG. 8. However, in further embodiments, the overlap need not be symmetrical. For example, FIG. 14 shows an embodiment where a device 100 on a surface 144, 146 may be asymmetrically overlapped by devices 100 on the opposed surface.

Figure 16:
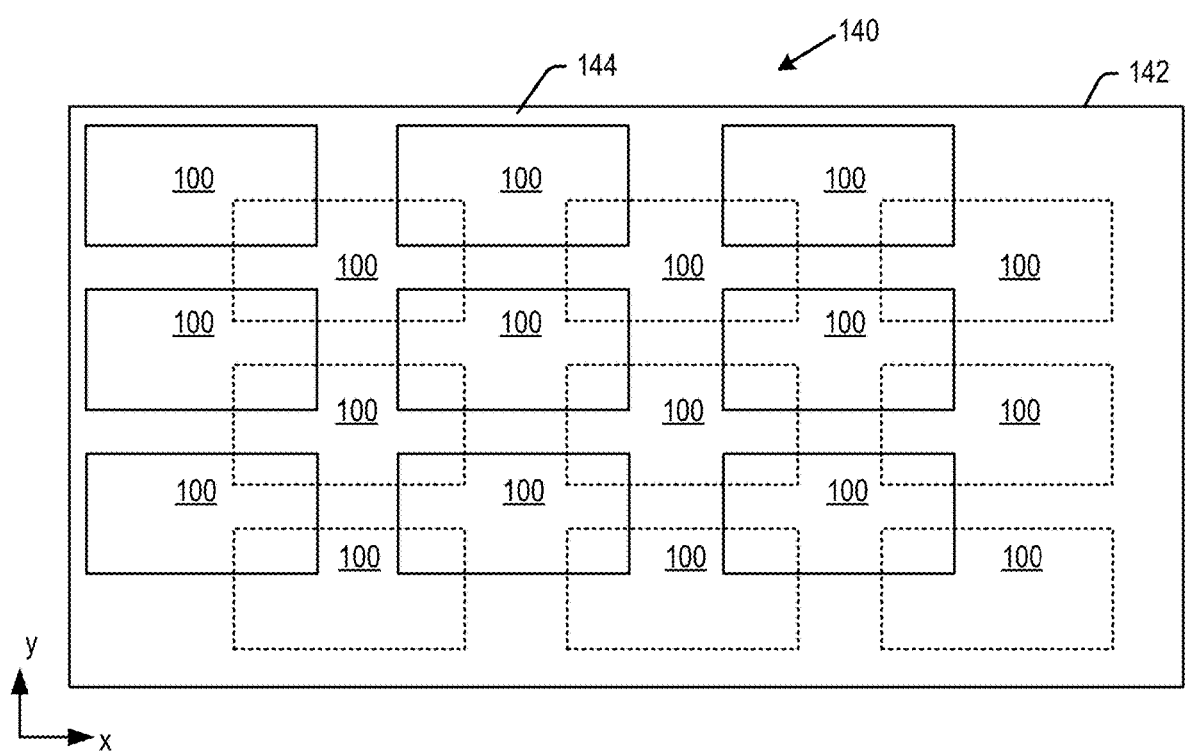
FIG. 16 is a top view of a host device including semiconductor devices staggered along the length and width dimensions of the semiconductor devices on opposed surfaces of a printed circuit board according to embodiments of the present technology.

In embodiments described above, the semiconductor devices 100 are staggered along the x-axis, corresponding to the length of the semiconductor devices 100. Such an example is shown in FIG. 9. However, it is conceivable that the device semiconductor devices 100 are staggered along the y-axis, corresponding to the width of the semiconductor devices 100. Such an embodiment is shown for example in FIG. 15. Moreover, it is conceivable that the semiconductor devices 100 be staggered along both the x-axis and the y-axis. Such an embodiment is shown for example in FIG. 16.

It is an advantage of the present technology to maintain the strain energy density of the solder balls of semiconductor devices on opposed surfaces of a PCB below a predefined threshold by staggering the semiconductor devices on the respective opposed surfaces. The degree of overlap of the respective devices on the opposed surfaces may be set for example in a configuration that will maximize the number of semiconductor devices on the PCB for a unit area, while still maintaining the strain energy density of the solder balls of semiconductor devices on opposed surfaces of a PCB below a predefined threshold.

In addition to maintaining the strain energy density below a predefined threshold, the present technology may control the degree of overlap to maintain or reduce strain energy density. For example, for given parameters of the semiconductor devices 100 and PCB 142 as described above, the degree of overlap of the devices 100 on the top and bottom surfaces of the of the PCB 142 may be controlled (reduced) to reduce the strain energy density of the solder balls 120. This reduction can be used to improve board level reliability and allow higher thermal cycle life for the solder joints.

In summary, in one example, the present technology relates to a semiconductor storage device, comprising: a printed circuit board comprising a first major surface and a second major surface opposed to the first major surface; a first group of one or more semiconductor devices, each semiconductor device of the first group of semiconductor devices comprising a first group of solder balls, the first group of solder balls affixing the first group of semiconductor devices to the first major surface of the printed circuit board at least along a first direction; and a second group of one or more semiconductor devices, each semiconductor device of the second group of semiconductor devices comprising a second group of solder balls, the second group of solder balls affixing the second group of semiconductor devices to the second major surface of the printed circuit board at least along the first direction; wherein the first group of one or more semiconductor devices on the first major surface are staggered with an overlap relative to the second group of one or more semiconductor devices on the second major surface along the first direction, the staggering enabling flexing of the printed circuit board upon warping of at least one of the first and second groups of one or more semiconductor devices.

In another example, the present technology relates to a semiconductor storage device, comprising: a pliable printed circuit board comprising a first major surface and a second major surface opposed to the first major surface, wherein the pliable printed circuit board is configured to flex; a first plurality of semiconductor devices, each semiconductor device of the first plurality of semiconductor devices comprising a first group of solder balls, the first group of solder balls affixing the first plurality of semiconductor devices to the first major surface of the pliable printed circuit board at least along a first direction; and a second plurality of semiconductor devices, each semiconductor device of the second plurality of semiconductor devices comprising a second group of solder balls, the second group of solder balls affixing the second plurality of semiconductor devices to the second major surface of the printed circuit board at least along the first direction; wherein the first plurality of semiconductor devices on the first major surface is staggered with an overlap relative to the second plurality of semiconductor devices on the second major surface along the first direction, and wherein the staggering allows flexing of the pliable printed circuit board upon warping of one or more of the first and second pluralities of semiconductor devices to maintain stain energy densities in the first and second groups of solder balls below a predefined threshold.

In a further example, the present technology relates to a semiconductor storage device, comprising: a printed circuit board comprising a first major surface and a second major surface opposed to the first major surface; a first group of one or more semiconductor devices, each semiconductor device of the first group of semiconductor devices comprising a first group of solder balls, the first group of solder balls affixing the first group of semiconductor devices to the first major surface of the printed circuit board at least along a first direction; a second group of one or more semiconductor devices, each semiconductor device of the second group of semiconductor devices comprising a second group of solder balls, the second group of solder balls affixing the second group of semiconductor devices to the second major surface of the printed circuit board at least along the first direction; and means for enabling flexing of the printed circuit board to maintain contact with the first and second groups of semiconductor devices on both the first and second major surfaces upon warping of at least one of the first and second groups of one or more semiconductor devices.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor storage device, comprising:
   a printed circuit board comprising a first major surface and a second major surface opposed to the first major surface;
   a first group of one or more semiconductor devices, each semiconductor device of the first group of semiconductor devices comprising a first group of solder balls, the first group of solder balls affixing the first group of semiconductor devices to the first major surface of the printed circuit board at least along a first direction; and
   a second group of one or more semiconductor devices, each semiconductor device of the second group of semiconductor devices comprising a second group of solder balls, the second group of solder balls affixing the second group of semiconductor devices to the second major surface of the printed circuit board at least along the first direction;
   wherein the first group of one or more semiconductor devices on the first major surface are staggered with an overlap relative to the second group of one or more semiconductor devices on the second major surface along the first direction, the staggering enabling flexing of the printed circuit board upon warping of at least one of the first and second groups of one or more semiconductor devices.

2. The semiconductor storage device of claim 1, wherein first and second semiconductor devices of the first group of semiconductor device are symmetrically staggered on the first major surface with respect to a first semiconductor device of the second group of semiconductor devices on the second major surface.

3. The semiconductor storage device of claim 1, wherein first and second semiconductor devices of the first group of semiconductor device are asymmetrically staggered on the first major surface with respect to a first semiconductor device of the second group of semiconductor devices on the second major surface.

4. The semiconductor storage device of claim 1, wherein the printed circuit board comprises a pliant material.

5. The semiconductor storage device of claim 1, wherein the first group of one or more semiconductor devices on the first major surface has a same number of devices as the second group of one or more semiconductor devices on the second major surface.

6. The semiconductor storage device of claim 1, wherein the first and second groups of one or more semiconductor devices overlap on the first and second major surfaces by between 5% and 45%.

7. The semiconductor storage device of claim 1, wherein the first and second groups of one or more semiconductor devices overlap on the first and second major surfaces by between 20% and 30%.

8. The semiconductor storage device of claim 1, wherein the first and second groups of one or more semiconductor devices are staggered on the first and second major surfaces with no overlap.

9. The semiconductor storage device of claim 1, wherein each semiconductor device of the first and second groups of semiconductor devices comprises a length and a width, the length being greater than the width, and wherein the lengths of the semiconductor devices in the first and second groups of semiconductor devices are oriented along the first direction.

10. The semiconductor storage device of claim 1, wherein each semiconductor device of the first and second groups of semiconductor devices comprises a length and a width, the length being greater than the width, and wherein the widths of the semiconductor devices in the first and second groups of semiconductor devices are oriented along the first direction.

11. The semiconductor storage device of claim 1, wherein the first and second groups of semiconductor devices are also affixed to the first and second surfaces along a second direction orthogonal to the first to firm an array on the first and second major surfaces.

12. The semiconductor storage device of claim 11, wherein the first and second groups of semiconductor devices are also staggered with an offset along the second direction.

13. The semiconductor storage device of claim 1, wherein the first and second groups of semiconductor devices each comprise one or more semiconductor memory dies.

14. The semiconductor storage device of claim 1, wherein the semiconductor storage device is a solid state drive and the first and second groups of semiconductor devices comprise first and second groups of semiconductor memory devices.

15. A semiconductor storage device, comprising:
a pliable printed circuit board comprising a first major surface and a second major surface opposed to the first major surface, wherein the pliable printed circuit board is configured to flex;
a first plurality of semiconductor memory devices, each semiconductor memory device of the first plurality of semiconductor memory devices comprising a first group of solder balls, the first group of solder balls affixing the first plurality of semiconductor memory devices to the first major surface of the pliable printed circuit board at least along a first direction; and
a second plurality of semiconductor memory devices, each semiconductor memory device of the second plurality of semiconductor memory devices comprising a second group of solder balls, the second group of solder balls affixing the second plurality of semiconductor memory devices to the second major surface of the printed circuit board at least along the first direction;
wherein the first plurality of semiconductor memory devices on the first major surface is staggered with an overlap relative to the second plurality of semiconductor memory devices on the second major surface along the first direction, and
wherein the staggering allows flexing of the pliable printed circuit board upon warping of one or more of the first and second pluralities of semiconductor memory devices to maintain stain energy densities in the first and second groups of solder balls below a predefined threshold.

16. The semiconductor storage device of claim 15, wherein the pliable printed circuit board comprises a polyimide film.

17. The semiconductor storage device of claim 15, wherein the first and second pluralities of semiconductor memory devices comprise System in a Package (SiP) devices, each SiP device including multiple memory dies.

18. The semiconductor storage device of claim 15, wherein first and second semiconductor memory devices of the first plurality of semiconductor memory device are symmetrically staggered on the first major surface with respect to a first semiconductor memory device of the second plurality of semiconductor memory devices on the second major surface.

19. The semiconductor storage device of claim 15, wherein the first and second groups of one or more semiconductor memory devices overlap on the first and second major surfaces by between 20% and 30%.

* * * * *